US012688992B2

(12) United States Patent
Ohshima et al.

(10) Patent No.: US 12,688,992 B2
(45) Date of Patent: Jul. 21, 2026

(54) ELECTRON BEAM APPLICATION DEVICE

(71) Applicant: Hitachi High-Tech Corporation,
Tokyo (JP)

(72) Inventors: Takashi Ohshima, Tokyo (JP);
Naohiro Kohmu, Tokyo (JP); **Hideo
Morishita, Tokyo (JP); Tatsuro Ide**,
Tokyo (JP); Yoichi Ose, Tokyo (JP);
Junichi Katane, Tokyo (JP); **Toshihide
Agemura**, Tokyo (JP)

(73) Assignee: **HITACHI HIGH-TECH
CORPORATION**, Tokyo (JP)

( * ) Notice: Subject to any disclaimer, the term of this
patent is extended or adjusted under 35
U.S.C. 154(b) by 367 days.

(21) Appl. No.: 18/282,906

(22) PCT Filed: Apr. 16, 2021

(86) PCT No.: PCT/JP2021/015741
§ 371 (c)(1),
(2) Date: Sep. 19, 2023

(87) PCT Pub. No.: WO2022/219814
PCT Pub. Date: Oct. 20, 2022

(65) Prior Publication Data
US 2024/0161997 A1     May 16, 2024

(51) Int. Cl.
*H01J 37/073*     (2006.01)
*H01J 37/147*     (2006.01)
*H01J 37/26*      (2006.01)
(52) U.S. Cl.
CPC ........ *H01J 37/073* (2013.01); *H01J 37/1471*
(2013.01); *H01J 37/265* (2013.01)
(58) Field of Classification Search
None
See application file for complete search history.

(56) References Cited

U.S. PATENT DOCUMENTS 5,557,105 A  *  9/1996  Honjo ................. H01J 37/3007
                                                    250/397
6,448,568 B1     9/2002  Allen et al.
                         (Continued)

FOREIGN PATENT DOCUMENTS

CN       109458959 A  *  3/2019  ............. G01B 11/30
JP       2001143648 A  *  5/2001
                         (Continued)

OTHER PUBLICATIONS

English machine translation for JP-2001143648-A (Year: 2001).*
(Continued)

*Primary Examiner* — David E Smith
*Assistant Examiner* — Alina Kaliszewski
(74) *Attorney, Agent, or Firm* — MATTINGLY &
MALUR, PC

(57)                    ABSTRACT

A light source that emits pulse excitation light includes a
laser light source, an optical splitter that splits a pulse laser
beam into a plurality of pulse laser beams, phase adjusters
and optical amplifiers provided for the pulse laser beams,
and an optical combiner that combines the plurality of pulse
laser beams whose phases are adjusted and that are ampli-
fied, and outputs combined light as the pulse excitation light.
An optical phase controller controls phase delay amounts of
the phase adjusters, and an optical monitor detects an
inclination of the pulse excitation light relative to an optical
axis of a focusing lens. The optical phase controller stores
phase delay amount data indicating phase delay amounts of
the plurality of phase adjusters in which the inclination is a
predetermined value, and sets the phase delay amounts of
the plurality of phase adjusters based on the phase delay
amount data.

15 Claims, 11 Drawing Sheets

(56) References Cited

U.S. PATENT DOCUMENTS

| | | | | |
|---|---|---|---|---|
| 8,217,352 | B2* | 7/2012 | Reed | H01J 37/26 |
| | | | | 250/311 |
| 2002/0053634 | A1* | 5/2002 | Watanabe | H01J 37/3174 |
| | | | | 250/201.2 |
| 2004/0190427 | A1* | 9/2004 | Ide | G11B 7/1353 |
| 2005/0084766 | A1* | 4/2005 | Sandstrom | G03F 7/70283 |
| | | | | 430/311 |
| 2008/0224039 | A1* | 9/2008 | Nakamura | H01J 37/045 |
| | | | | 250/310 |
| 2009/0080313 | A1* | 3/2009 | Shimada | G11B 7/1378 |
| | | | | 369/103 |
| 2011/0089397 | A1 | 4/2011 | Ujihara et al. | |
| 2013/0009058 | A1* | 1/2013 | Tanaka | H01J 37/073 |
| | | | | 250/311 |
| 2014/0291515 | A1* | 10/2014 | Tajima | H01J 37/244 |
| | | | | 382/141 |
| 2014/0346355 | A1* | 11/2014 | Ruan | H01J 37/26 |
| | | | | 250/311 |
| 2015/0014531 | A1* | 1/2015 | Yamazaki | H01J 37/244 |
| | | | | 250/311 |
| 2015/0060666 | A1* | 3/2015 | Hatakeyama | H01J 37/28 |
| | | | | 250/307 |
| 2015/0357154 | A1* | 12/2015 | Yokosuka | H01J 37/28 |
| | | | | 250/310 |
| 2015/0357155 | A1* | 12/2015 | Dohi | H01J 37/153 |
| | | | | 250/307 |
| 2017/0032937 | A1* | 2/2017 | Distaso | H01J 37/3211 |
| 2018/0286631 | A1* | 10/2018 | Axelrod | H01J 37/04 |
| 2018/0301317 | A1* | 10/2018 | Luiten | H01J 37/063 |
| 2019/0035594 | A1* | 1/2019 | Nikipelov | H01S 3/0903 |
| 2019/0051490 | A1* | 2/2019 | Tsuno | G01N 23/225 |
| 2019/0074159 | A1* | 3/2019 | Takahashi | H01J 37/28 |
| 2019/0096627 | A1* | 3/2019 | Ruan | H01J 37/263 |
| 2019/0355544 | A1* | 11/2019 | Riedesel | H01J 37/147 |
| 2020/0150240 | A1* | 5/2020 | Huwer | G01S 7/4865 |
| 2021/0090846 | A1* | 3/2021 | Liu | H01J 37/21 |
| 2021/0098222 | A1* | 4/2021 | Garcia Berrios | H01J 37/243 |
| 2021/0212189 | A1* | 7/2021 | Gonzales | H05G 1/70 |
| 2021/0287873 | A1* | 9/2021 | Ohira | H01J 37/24 |
| 2021/0341764 | A1* | 11/2021 | Du | H01S 3/23 |

FOREIGN PATENT DOCUMENTS

| | | | | | |
|---|---|---|---|---|---|
| JP | 2003-506828 | A | | 2/2003 | |
| JP | 2008288099 | A | * | 11/2008 | |
| JP | 2009-26680 | A | | 11/2009 | |
| JP | 2012-093675 | A | | 5/2012 | |
| JP | 2014-216418 | A | | 11/2014 | |
| KR | 20120106620 | A | * | 9/2012 | G01N 21/956 |
| NL | 1040008 | C2 | * | 7/2014 | G02B 21/367 |
| WO | WO-2018020626 | A1 | * | 2/2018 | H01J 37/28 |
| WO | WO-2019102603 | A1 | * | 5/2019 | H01J 37/228 |
| WO | WO-2020053967 | A1 | * | 3/2020 | H01J 37/28 |

OTHER PUBLICATIONS

English machine translation for KR-20120106620-A (Year: 2012).*
English machine translation for CN-109458959-A (Year: 2019).*
English machine translation for WO-2019102603-A1 (Year: 2019).*
English machine translation for WO-2020053967-A1 (Year: 2020).*
English machine translation for JP-2008288099-A (Year: 2008).*
English machine translation for WO-2018020626-A1 (Year: 2018).*
T. Y. Fan, "Laser Beam Combining for High-Power, High-Radiance Sources", IEEE Journal of Selected Topics in Quantum Electronics, vol. 11, No. 3, May/Jun. 2005.
W. Ronny Huang, et al., "High speed, high power one-dimensional beam steering from a 6-element optical phased array", Optics Express, vol. 20, No. 16, Jul. 30, 2012, pp. 17311-17318.
Arno Klenke, et al., "Coherent Beam Combination of Ultrafast Fiber Lasers", IEEE Journal of Selected Topics in Quantum Electronics, vol. 24, No. 5, Sep./Oct. 2018.
International Search Report of PCT/JP2021/015741 dated Jul. 13, 2021.

* cited by examiner

[FIG. 1A]
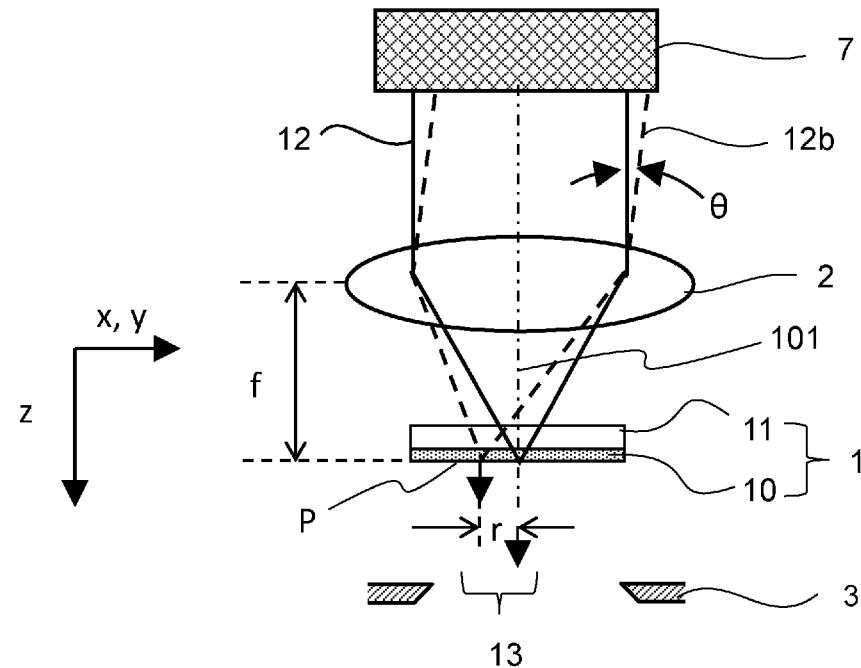
[FIG. 1B]
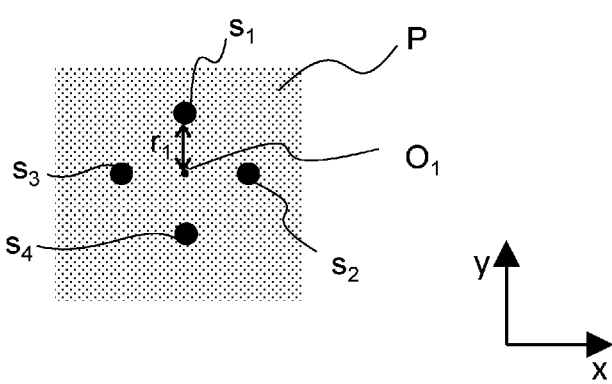

[FIG. 1C]
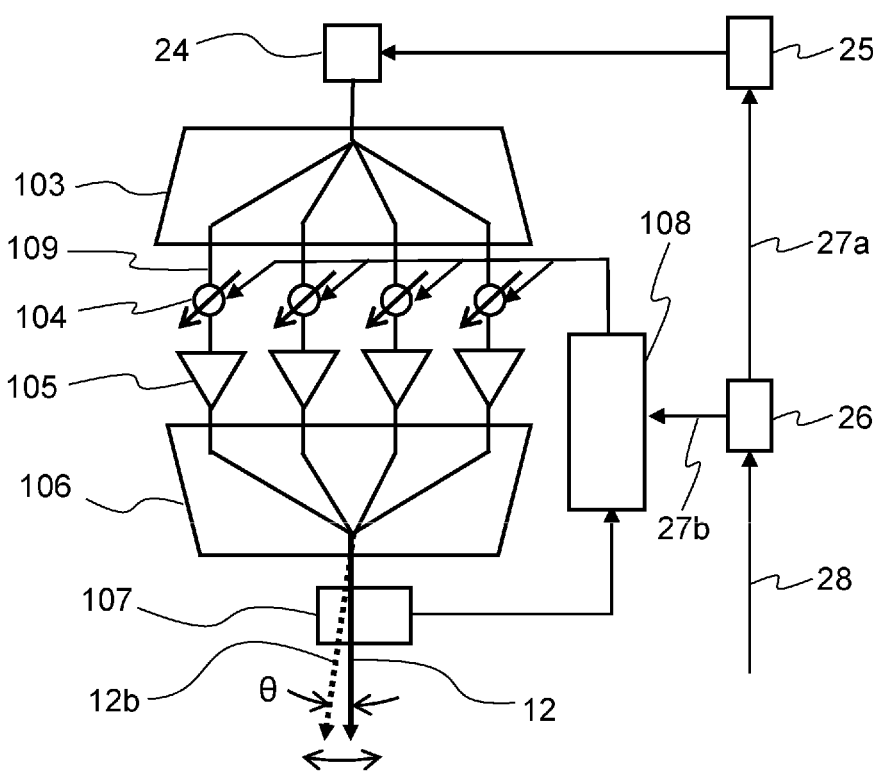
[FIG. 1D]
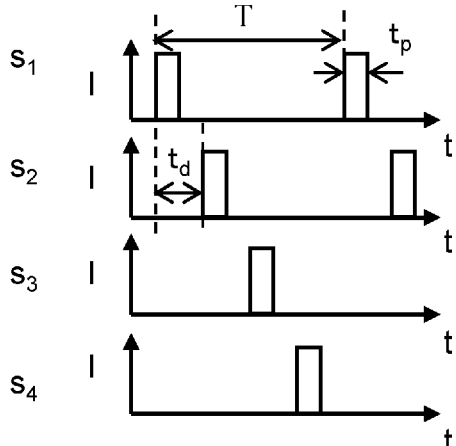

[FIG. 2A]
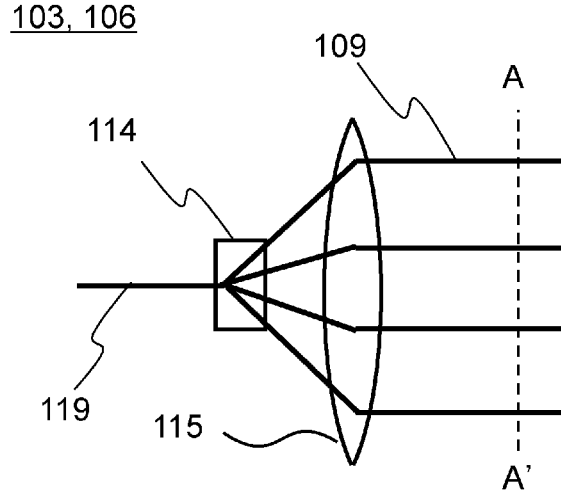
[FIG. 2B]
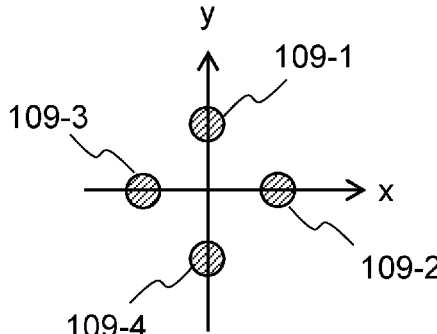
[FIG. 2C]
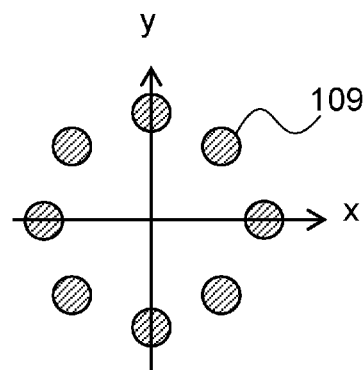

[FIG. 2D]
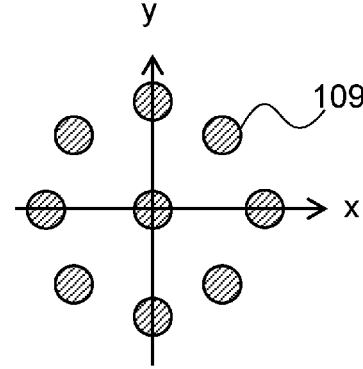
[FIG. 3]
104
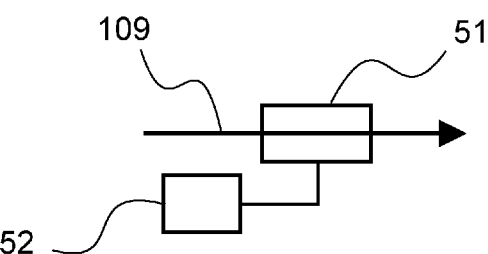
[FIG. 4A]
105
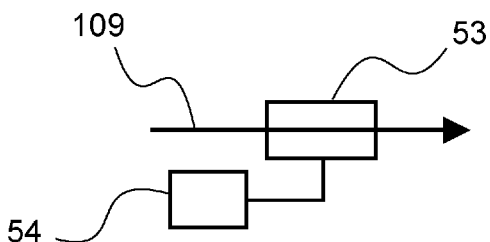

[FIG. 4B]
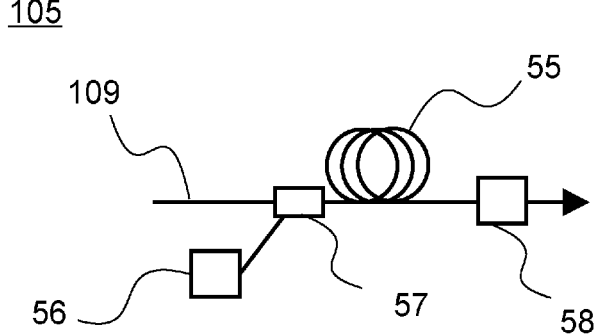
[FIG. 5]
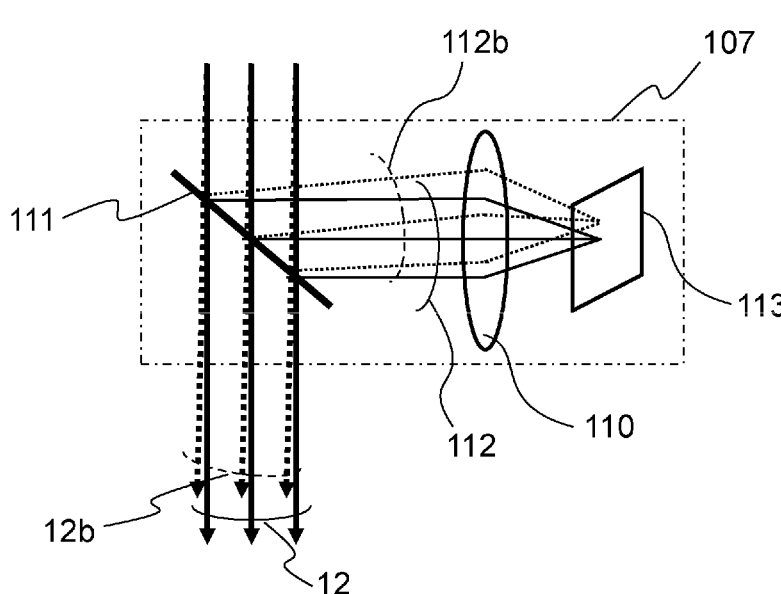

[FIG. 6]
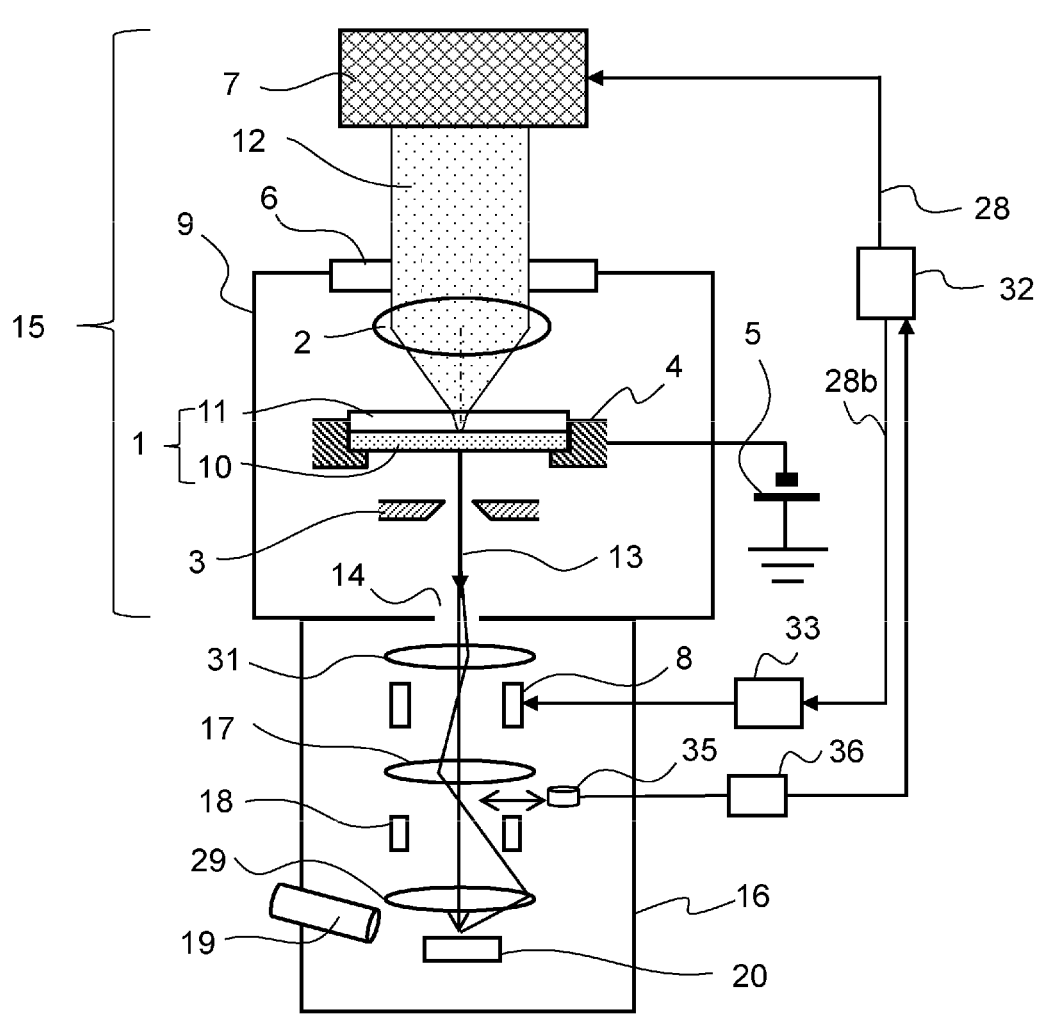

[FIG. 7A]
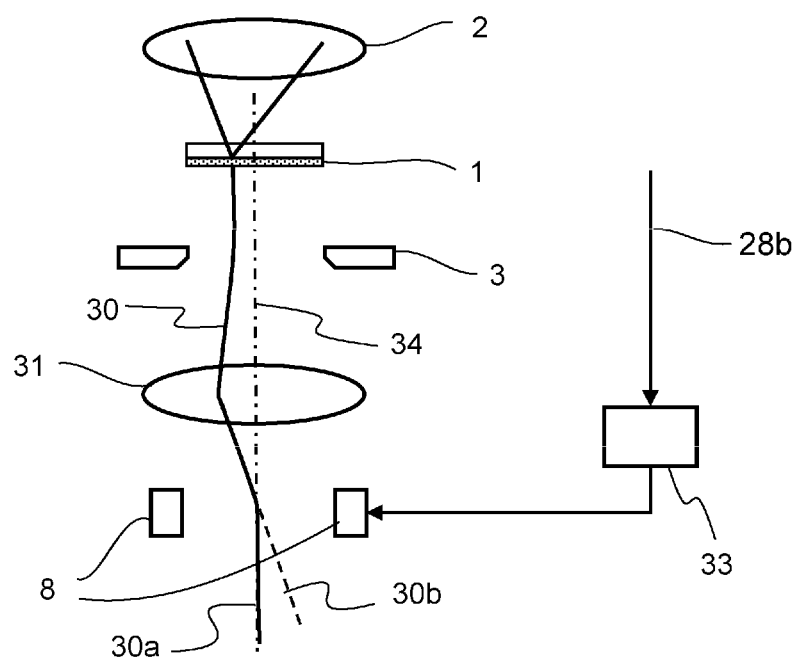
[FIG. 7B]
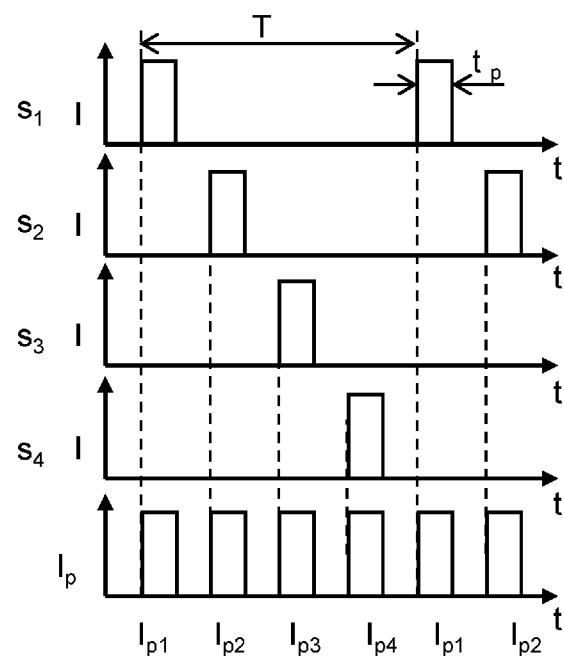

[FIG. 8]
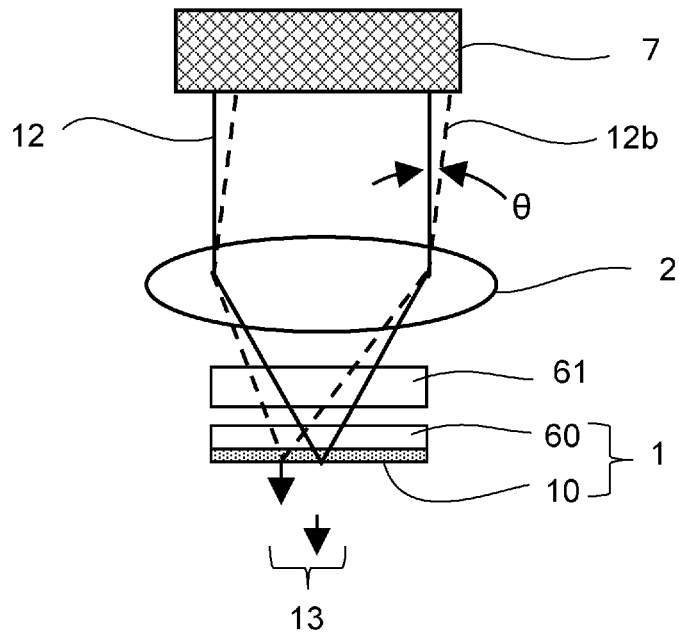
[FIG. 9A]
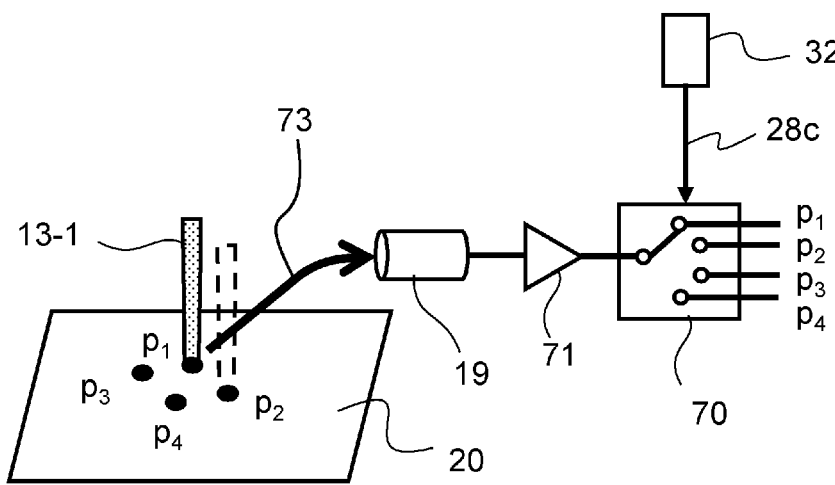

[FIG. 9B]
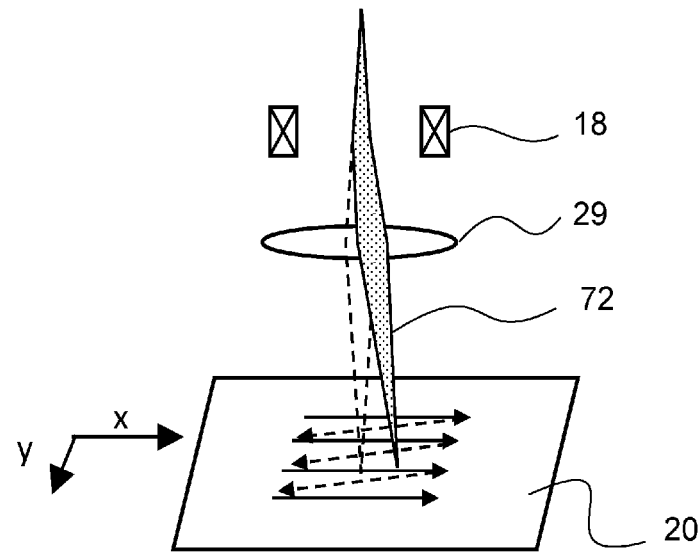
[FIG. 9C]
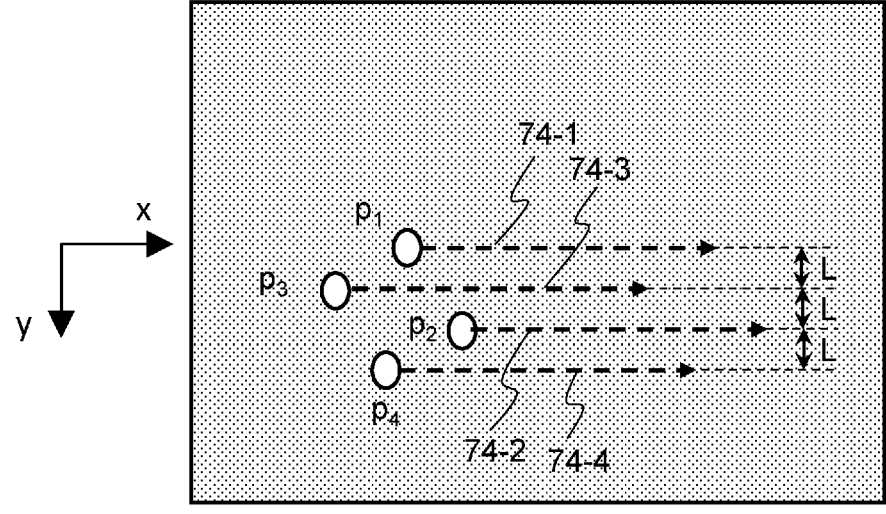

[FIG. 9D]
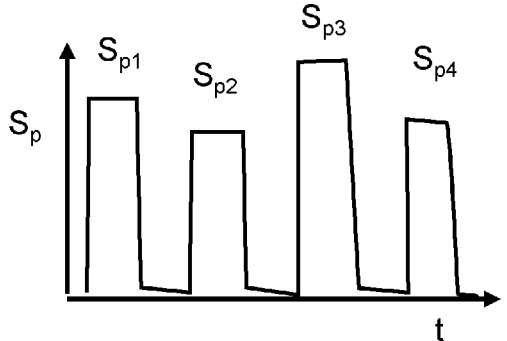
[FIG. 10]
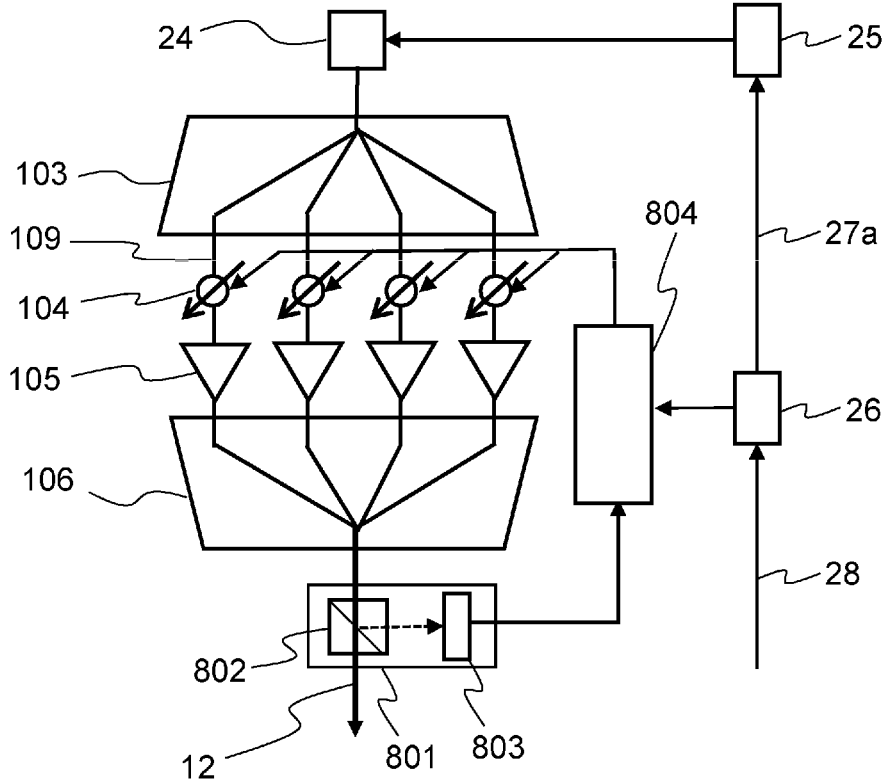

[FIG. 11A]
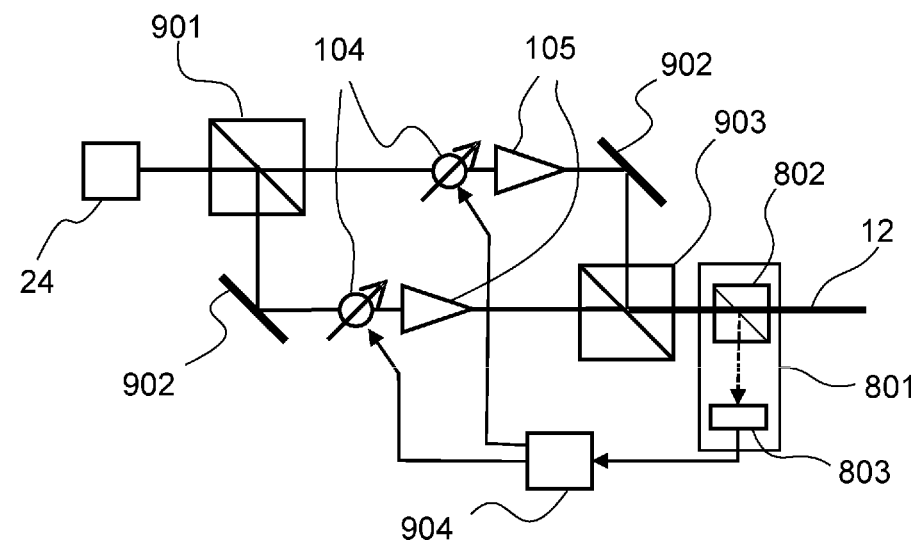
[FIG. 11B]
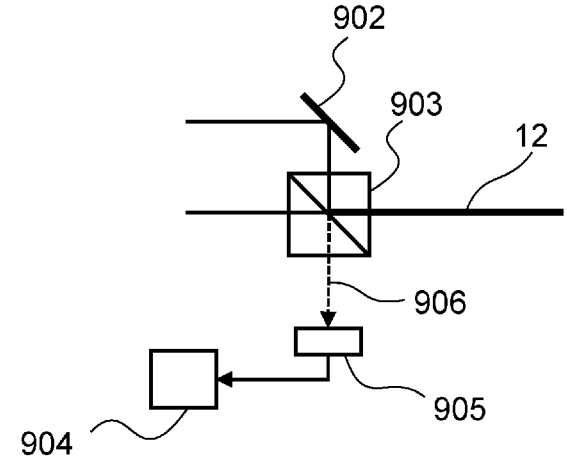

ELECTRON BEAM APPLICATION DEVICE

TECHNICAL FIELD

The present invention relates to an electron beam application device using a photo excited electron source.

BACKGROUND ART

An electron microscope having high resolution requires an electron source that has high brightness and that emits an electron beam having a narrow energy width. Further, in recent years, a microscope observation technique using a pulse electron beam as a probe has been advanced for the purpose of capturing a high-speed temporal change in addition to high spatial resolution. A photocathode that generates a pulse electron beam by light pulse incidence is extremely useful for capturing a phenomenon that changes at high speed. In particular, a photo excited electron source (photocathode) using a negative electron affinity (NEA) is a planar electron source, and a focus size of excitation light serving as a source size is as large as about 1 μm. Since emitted electrons travel straight, high brightness can be expected by increasing a current density.

PTL 1 discloses an electron gun using such a photocathode. An electron gun structure is disclosed in which a transparent substrate is used as a photocathode, specifically, a transparent substrate formed by sticking a photocathode film (photo electric film) on glass is used, a small electron source is formed by focusing excitation light on the photo electric film to a diffraction limit using a focusing lens that has a numerical aperture (NA) of about 0.5 and that is placed close to the transparent substrate, and an electron beam emitted from the electron source into a vacuum is used. As a photocathode suitable for high brightness, development of a semiconductor photocathode in which a photocathode layer is formed on a semiconductor substrate using a semiconductor crystal growth technique has been advanced as disclosed in PTL 2.

A pulse laser beam is used as excitation light for exciting a photocathode to generate a pulse electron beam. NPL 1 discloses coherent beam combining as an example of a method for amplifying an intensity without lowering quality of the laser beam. For example, NPL 2 discloses a method for changing an angle of an emitted laser beam at high speed using the method disclosed in NPL 1.

CITATION LIST

Patent Literature

PTL 1: JP2001-143648A
PTL 2: JP2009-266809A

Non Patent Literature

NPL 1: T. Y. Fan, "Laser Beam Combining for High-Power, High-Radiance Sources", IEEE JOURNAL OF SELECTED TOPICS IN QUANTUM ELECTRONICS, VOL. 11, NO. 3, 2005, P 567-577
NPL 2: W. R. Huang, et al. "High speed, high power one-dimensional beam steering from a 6-element optical phased array", OPTICS EXPRESS, Vol. 20, No. 16, 2012, p 17311-17318

SUMMARY OF INVENTION

Technical Problem

Even when an intensity of excitation light is increased in order to increase brightness of a photo excited electron source, a probe current obtained by continuous light is saturated in the intermediate and does not increase. Even in a case of performing excitation with pulsed light, a linear increase is not observed in an intensity of the pulsed light. Since a semiconductor laser (laser diode) serving as a light source of excitation light can control a pulse width and a frequency of the semiconductor laser by an electric signal, the semiconductor laser is excellent in being used as an excitation light source for a photo excited electron source, but has an upper limit in an intensity of excitation light that can be output.

Solution to Problem

An electron beam application device according to an embodiment of the present invention includes an electron gun that includes a photocathode including a substrate and a photo electric film, a light source configured to emit pulse excitation light, and a focusing lens configured to focus the pulse excitation light toward the photocathode, and that is configured to emit pulse electron beams from a position of the photo electric film where the pulse excitation light is focused, and an electron optics configured to irradiate a sample with the pulse electron beams, in which the light source includes a laser light source, a power supply configured to supply power to the laser light source to emit a pulse laser beam, an optical splitter configured to split a pulse laser beam emitted by the laser light source into a plurality of pulse laser beams, a plurality of phase adjusters each provided for a respective one of the plurality of pulse laser beams and configured to adjust phases of the pulse laser beams split by the optical splitter, a plurality of optical amplifiers each provided for a respective one of the plurality of pulse laser beams and configured to amplify the pulse laser beams split by the optical splitter, an optical combiner configured to combine the plurality of pulse laser beams whose phases are adjusted by the phase adjusters and that are amplified by the optical amplifier and output the light as the pulse excitation light, and an optical phase controller configured to control phase delay amounts of the plurality of phase adjusters, and the optical phase controller stores phase delay amount data indicating the phase delay amounts of the plurality of phase adjusters in which an inclination of the pulse excitation light relative to an optical axis of the focusing lens is a predetermined value, and sets the phase delay amounts of the plurality of phase adjusters based on the phase delay amount data.

Advantageous Effects of Invention

Provided is an electron beam application device including a photo excited electron source that emits a high-brightness pulse electron beam.

Other problems and novel features will become apparent from the description of the present specification and the accompanying drawings.

BRIEF DESCRIPTION OF DRAWINGS

FIG. 1A shows a configuration example of a photo excited electron gun.

FIG. 1B is a diagram showing a plurality of electron sources formed on a photo electric film.

FIG. 1C shows a configuration example of an excitation optical system having an angle modulation function.

FIG. 1D is a time chart showing light intensities I at light focusing points $s_i$.

FIG. 2A shows a configuration example of an optical splitter or an optical combiner.

FIG. 2B shows an example of split laser beams.

FIG. 2C shows an example of the split laser beams.

FIG. 2D shows an example of the split laser beams.

FIG. 3 shows a configuration example of a phase adjuster.

FIG. 4A shows an optical amplifier using a semiconductor type amplifier.

FIG. 4B shows an optical amplifier using an optical fiber type amplifier.

FIG. 5 shows a configuration example of an optical monitor.

FIG. 6 shows a schematic configuration of a scanning electron microscope.

FIG. 7A shows an electron optics in the scanning electron microscope according to Embodiment 1.

FIG. 7B is a time chart showing a probe current $I_p$ of a pulse electron beam according to Embodiment 1.

FIG. 8 shows an example of an excitation light focusing optical system.

FIG. 9A shows a configuration example of a detection system according to Embodiment 2.

FIG. 9B shows an example (raster scanning method) of scanning with a pulse electron beam.

FIG. 9C is a view showing trajectories of positions irradiated with the pulse electron beam.

FIG. 9D is a diagram showing magnitudes of detection signals at the positions irradiated with the pulse electron beam.

FIG. 10 shows a configuration example of an excitation optical system.

FIG. 11A shows a configuration example of an excitation optical system.

FIG. 11B shows a configuration example of an optical monitor of the excitation optical system shown in FIG. 11A.

DESCRIPTION OF EMBODIMENTS

Embodiment 1

FIG. 1A shows a configuration of a photo excited electron gun that forms a plurality of electron sources in a photocathode. Pulse excitation light 12 from a parallel light source 7 is focused by a focusing lens 2, and is radiated to a photo electric film 10 supported on a transparent substrate 11. When a direction of the pulse excitation light 12 (solid line) is parallel to a central axis 101 of an excitation light focusing optical system, a pulse electron beam 13 is emitted from a point of the central axis 101 on the photo electric film 10. The central axis 101 is an optical axis of the focusing lens 2. The parallel light source 7 which is an excitation light source has an angle modulation function and can change an angle at which excitation light is emitted. When the parallel light source 7 generates inclined pulse excitation light 12b (broken line), the pulse excitation light 12b is subjected to the action of the focusing lens 2, and is focused at a position away from the central axis 101 on the photo electric film 10. r=f·tan θ (Equation 1), in which r is a distance between a focal point and the central axis, and θ is an angle formed by a direction of the inclined pulse excitation light 12b and the central axis 101. Here, f is a focal length of the focusing lens 2. In this manner, the distance r from a central axis of an electron source can be determined by an inclination θ of excitation light.

The parallel light source 7 emits the pulse excitation light 12b while changing the inclination θ, so that a plurality of electron sources $s_1$, $s_2$, $s_3$, and $s_4$ are formed on a cathode surface (photo electric film) P as shown in FIG. 1B. FIG. 1B shows an intersection $O_1$ between the cathode surface P and the central axis 101. As described above, a distance $r_i$ between an electron source $s_i$ and the intersection $O_1$ on the cathode surface P depends on an inclination $θ_i$ of the pulse excitation light 12b relative to the central axis 101. A point (the intersection $O_1$) on the central axis 101 is not included in the light focusing point $s_i$ of excitation light serving as the electron sources in the example shown in FIG. 1B. Alternatively, a light focusing point of excitation light may be formed at the position of the point $O_1$. The inclination θ is an inclination in a three-dimensional space, and when a direction of the central axis 101 is defined as a z axis and an xy plane defined by an x axis and a y axis is a plane perpendicular to the z axis, the distance r and the inclination θ can be respectively expressed as vectors $(r_x, r_y)$ and $(θ_x, θ_y)$ each having an x-axis direction component and a y-axis direction component.

FIG. 1C shows a configuration example of an excitation optical system having an angle modulation function of the parallel light source 7. A pulse laser beam is emitted from a laser light source 24 by power of a pulse light power supply 25. The laser light source 24 is implemented by a combination of a semiconductor laser (laser diode) and a collimator lens, and emits a pulse laser beam as spatial light. The semiconductor laser is suitable for a light source of an electron beam application device such as an electron microscope since a repetition period and a pulse width of an emitted pulse laser beam can be more easily adjusted by controlling a power supply. An excitation optical system according to the present embodiment generates the excitation light 12 and the inclined excitation light 12b by increasing an intensity of a pulse laser beam by coherent beam combining and controlling an emission direction (the inclination θ) for each pulse. Components of the excitation optical system include an optical splitter 103 that splits one laser beam into a plurality of laser beams 109, phase adjusters 104 that adjust phases of the split laser beams 109, optical amplifiers 105 that amplify the split laser beams 109, an optical combiner 106 that combines the amplified laser beams 109 into one laser beam again, and an optical phase controller 108 that optimizes a phase delay in each of the phase adjusters 104. When the phases of the laser beams 109 incident on the optical combiner 106 coincide with one another, the combined laser beam becomes the excitation light 12 parallel to the central axis 101. On the other hand, the phase delay in each phase adjuster 104 is set such that the phases of the laser beams 109 are slightly shifted. Accordingly, the combined laser beam can become the inclined excitation light 12b inclined relative to the central axis 101.

FIG. 2A shows a configuration example of the optical splitter 103. The optical splitter 103 includes a diffractive optical element (DOE) 114 and a collimator 115. The DOE 114 is an optical element in which fine irregularities are formed on a surface of a transparent material. A laser beam 119 perpendicularly incident on the DOE 114 is split into a plurality of laser beams by being diffracted by the fine irregularities on a DOE surface, and the split laser beams 109 having optical paths parallel to one another are obtained from the collimator 115. A pattern of the laser beams split by the DOE 114 is determined according to a shape of the irregularities on the DOE surface. For example, FIG. 2B shows laser beams in an A-A' cross section shown in FIG. 2A. The laser beam 119 is split by the optical splitter 103 into laser beams 109-1 to 109-4 indicated by four circles in FIG. 2B.

When the split laser beams 109 are incident on an optical element shown in FIG. 2A from a right side of the figure, the combined laser beam 119 can be obtained, and in this case, the optical element shown in FIG. 2A functions as the optical combiner 106. As described above, in order to emit the laser beam 119 perpendicularly to the DOE, it is required that phases of the split laser beams 109 coincide with one another.

By combining the optical splitter 103 and the optical combiner 106 in this manner, a plurality of split optical paths are provided in one optical path, and an inclination of an optical path on an emission side can be changed by adjusting a phase delay in each of the split optical paths. Although FIG. 2B shows an example in which the optical paths are split to four optical paths, the number and an arrangement of the split optical paths can be changed by designing the irregularities of the DOE 114. For example, FIG. 2C shows an example in which the number of split optical paths is increased, and FIG. 2D shows an example in which an optical path that does not diffract and passes through an element is also provided in a central portion. A reflective DOE may be used instead of a transmissive DOE shown in FIG. 2A. In this case, it is necessary to form a desired optical path by adding a mirror or the like.

The collimator 115 may use a single lens when a cross-sectional area of the excitation light 12 is extremely small, but in the case of a beam having an area, the collimator 115 preferably uses a lens array or a prism array optimized for each split laser beam 109.

For example, the phase adjuster 104 includes an electro-optical element 51 and a voltage applying power supply 52 that applies a voltage to the electro-optical element 51, as shown in FIG. 3. Modulation of a phase of the laser beam 109 that passes through the phase adjuster 104 can be adjusted according to the voltage applied from the power supply 52.

In the excitation optical system according to the present embodiment, in order to increase an intensity of the excitation light 12 to be finally output, the optical amplifier 105 is provided in each split optical path. A compact semiconductor type amplifier (FIG. 4A) or an optical fiber type amplifier (FIG. 4B) can be applied as the optical amplifier 105. For example, as shown in FIG. 4A, the semiconductor type amplifier includes a semiconductor amplifying element 53 and a current applying power supply 54 that injects a bias current to the semiconductor amplifying element 53. The laser beam 109 that passes through the optical amplifier 105 can be amplified according to the bias current applied from the power supply 54. For example, as shown in FIG. 4B, the optical fiber type amplifier includes an optical amplifying fiber 55 to which a light-emitting element is added, a pump light source 56 that injects pump light into the optical amplifying fiber 55, and a coupler 57. When a well-known erbium ($Er^{3+}$) doped optical fiber is used as the optical amplifying fiber 55, a wavelength converter 58 is further provided between the optical amplifying fiber 55 and the optical combiner 106. When a GaAs photocathode is used as a photocathode 1, a wavelength of the laser beam 109 is 750 nm to 780 nm, and a band in which the erbium doped optical fiber performs amplification is about 1500 nm. Therefore, a semiconductor laser that emits a laser beam of a band of 1500 nm may be used as a semiconductor laser used for the laser light source 24, and the semiconductor laser may enter the wavelength converter 58 after being amplified and may be converted into a laser beam of a half wavelength. Although the wavelength conversion performed by the wavelength converter 58 may be performed on a laser beam combined in the optical combiner 106, an intensity of a laser beam after combining is high and the wavelength converter 58 may be damaged. Therefore, here, the wavelength conversion is performed on a laser beam before combining.

Light between optical elements that constitute the excitation optical system may be transmitted as spatial light or may be transmitted in an optical fiber. The spatial light and the optical fiber are joined by a common technique, that is, alignment of a fiber end and a lens.

In order to determine phase delay amounts to be set in the phase adjusters 104 in the excitation optical system, an optical monitor 107 that measures a state of the excitation light 12 emitted from the excitation optical system is provided. FIG. 5 shows a configuration of the optical monitor 107. The optical monitor 107 includes a transparent mirror 111, an imaging lens 110, and an image sensor 113. The transparent mirror 111 is an optical element that transmits most (for example, 90% or more) of the incident excitation light 12, 12b and that reflects a part (for example, 10% or less) of the excitation light 12, 12b, and extracts reflected light from the transparent mirror 111 as sample light 112, 112b. Since the excitation light emitted from the excitation optical system is parallel light beams, the parallel light beams 12 and 12b are represented by three straight lines in the drawing. An optical axis of the imaging lens 110 is orthogonal to the central axis 101, and a distance between the imaging lens 110 and the image sensor 113 is a focal length of the imaging lens 110. The focal length is selected to be a value at which an adjustment to be described below can be accurately performed in the image sensor 113.

When the excitation light emitted from the excitation optical system is parallel to the central axis 101, the sample light 112 is focused at one point by the image sensor 113. The optical phase controller 108 adjusts phase delay amounts of the phase adjusters 104 such that a shape of a sample light image formed on the image sensor 113 is an image in a focused state, and stores phase delay amount data indicating the adjusted phase delay amounts of the phase adjusters 104 in a storage of the optical phase controller 108. At this time, since phases of the split light beams 109 incident on the optical combiner 106 are adjusted to coincide with one another, the excitation light 12 having the inclination angle $\theta=0$ $((\theta_x, \theta_y)=(0, 0))$ is emitted from the excitation optical system.

Subsequently, the optical phase controller 108 shifts the phase delay amounts of the phase adjusters 104 little by little from a phase adjustment value of the inclination angle $\theta=0$, and the optical monitor 107 monitors a position of the sample light image formed on the image sensor 113. The position of the sample light image formed on the image sensor 113 corresponds to a light focusing point of the excitation light on a cathode surface P shown in FIG. 1B. Therefore, the phase delay amounts of the phase adjusters 104 are adjusted such that a relative position between the point $O_1$ and the light focusing point $s_i$ on the cathode surface P corresponds to a relative position between a position of the sample light image when the phase adjustment value of the inclination angle $\theta=0$ in the image sensor 113 and a position of the sample light image when the phase delay amounts of the phase adjusters 104 are shifted, and the phase delay amount data indicating the adjusted phase delay amounts of the phase adjusters 104 is stored in the storage.

By repeating the same processing for each light focusing point $s_i$, the phase delay amount data for each light focusing point (electron source) $s_i$ is stored in the storage of the optical phase controller 108.

Control of the photo excited electron gun will be described with reference to FIGS. 1C and 1D. A control signal 28 including information such as a period and a pulse width of a pulse electron beam generated by the photo excited electron gun is sent from a control device of an electron microscope to a controller 26. The controller 26 outputs a light emission control signal 27a to the pulse light power supply 25 and a phase control signal 27b synchronized with the light emission control signal 27a to the optical phase controller 108 so as to generate the excitation light 12 according to the period and the pulse width of the pulse electron beam.

In the excitation optical system according to the present embodiment, a pulse width of the excitation light 12 can be controlled regardless of whether the pulse width is longer than microseconds or shorter than picoseconds. From the viewpoint of application of a pulse electron beam in an electron microscope, a beam having a pulse width from nanoseconds to picoseconds is highly useful. Since the excitation optical system according to the present embodiment does not control an emission direction of the excitation light by a mechanical movable component, there is an advantage in that the excitation optical system can be controlled at high speed. In order to observe pixels with an electron beam of one or more pulses during scanning of a scanning electron microscope, it is desirable to set a repetition frequency of excitation light to 1 MHz or more. In the excitation optical system according to the present embodiment, excitation light having a repetition frequency up to about 100 MHz can be emitted without any problem.

FIG. 1D is a time chart showing light intensities I at light focusing points $s_i$ (i=1 to 4). The light focusing points $s_i$ are the light focusing points $s_i$ shown in FIG. 1B. The laser light source 24 emits pulse laser beams having a pulse width $t_p$ in a period $t_d$, and the optical phase controller 108 receives the phase control signal 27b and switches and sets the phase delay amount data stored in the storage to the phase adjuster 104 for each pulse laser beam, thereby irradiating different places of the cathode surface P with excitation light as shown in FIG. 1B. Since each light focusing point is excited by a pulse laser beam in a period T, a pulse electron beam is emitted from each light focusing point (electron source) $s_i$ in the same time chart with a shifted timing. A relationship between the period $t_d$ of the laser light source 24 and the period T of electron emission at each electron source $s_i$ can be expressed by Equation 2.

$$T = n \cdot t_d \qquad \text{(Equation 2)}$$

n is the number of light focusing points, and n=4 in the example shown in FIG. 1D.

FIG. 6 shows a schematic configuration (first electron microscope configuration) of a scanning electron microscope using the photo excited electron gun according to Embodiment 1. A photo excited electron gun 15 includes a vacuum container 9 and the excitation light focusing optical system shown in FIG. 1A. In the vacuum container 9, the photocathode 1 is placed on a cathode holder 4 on which an acceleration voltage $-V_0$ is applied from an acceleration power supply 5 to an extractor electrode 3, and the pulse electron beam 13 generated from the photocathode 1 passes through an opening 14 of the vacuum container 9 at an acceleration $V_0$ and enters an electron optics column 16. The excitation light 12 is taken into the vacuum container 9 through a window 6. In the electron optics column 16, the pulse electron beam 13 reduced by electron lenses such as a condenser lens 31, an electron lens 17, and an objective lens 29 is incident on a sample 20, and electrons generated from the sample 20 are converted into an electric signal by an electron detector 19. A position at which the pulse electron beam 13 is incident on the sample 20 is changed by a deflector 18, and an image forming unit (not shown) forms an image based on position information and a signal from the electron detector 19 to obtain a scanning electron microscope image (SEM image).

FIG. 7A shows details of electron optics shown in FIG. 6. A trajectory 30 of a pulse electron beam emitted from a focal point ($S_k$) of excitation light formed at a position away from an optical axis 34 of the electron optics passes through the extractor electrode 3, advances in a direction further away from the optical axis 34, and is swung back by the condenser lens 31. Here, the trajectory 30 is about to advance as a trajectory 30b (a broken line), but the trajectory 30 is deflected by an aligner 8, and advances as a trajectory 30a which coincides with the optical axis 34. As shown in FIG. 1D, since different electron sources $s_i$ (i=1 to n) on the photocathode 1 emit electrons over time, a deflection amount of the aligner 8 is controlled corresponding to the electron source $s_i$ such that pulse electron beams emitted from the electron source $s_i$ have the same trajectory 30a and are emitted to the same position on the sample. Therefore, an aligner power supply 33 that controls a deflection amount (including a deflection direction and a deflection magnitude) of an electron beam deflected by the aligner 8 is controlled according to a deflection control signal 28b output from a microscope control device 32 in synchronization with a light emission control signal 27a. The aligner 8 may be an aligner that deflects an electron beam by a magnetic field or an aligner that deflects an electron beam by an electric field. When a pulse width of a pulse electron beam or an interval up to subsequent emission of a pulse electron beam is short, a high-speed electrostatic aligner is preferable. As a result, a probe current $I_p$ of the pulse electron beam 13 incident on the sample 20 is the sum of probe currents $I_{p1}$ to $I_{p4}$ of pulse electron beams from the respective electron sources $s_1$ to $s_4$, and substantial brightness becomes four times of brightness in the case of one pulse electron beam, as shown in FIG. 7B. When the number of electron sources is multiple, an effect of increasing brightness can be achieved. When the number of electron sources is increased to, for example, 10 or 100, a further increase in brightness can be achieved.

The aligner 8 deflects the pulse electron beam 13 such that a trajectory of the pulse electron beam 13 coincides with the optical axis 34 of the electron optics in the example described above. Alternatively, the trajectory after deflection may be inclined because the same effect is attained when the pulse electron beam 13 is viewed as one beam. That is, trajectories of pulse electron beams from the electron source $s_i$ (i=1 to n) after the pulse electron beams are deflected by the aligner 8 may be the same.

Further, in order to align the trajectories of the pulse electron beams from the electron sources $s_1$ to $s_4$, the same effect can be attained by superimposing, on a deflection signal, a signal for correcting a trajectory difference due to a position difference of the electron sources for the deflector 18 (see FIG. 6), instead of the aligner 8. In this case, the deflection control signal 28b is input to the deflector 18 and includes correction information based on positions of the electron sources and a magnification and a rotation angle of the electron optics.

An optimum example of the excitation light focusing optical system will be described. When an aspherical lens having a numerical aperture NA of 0.5 and a focal length f of 4.2, which is optimized when the transparent substrate 11 is made of glass or the like having a thickness of 1.2 mm and a refractive index of about 1.5, is used as the focusing lens 2, excitation light to be focused on the photocathode 1 is narrowed down to a diffraction limit at a wavelength of excitation light at a position within about 80 μm from an axial center. Therefore, in order to obtain high brightness, the electron source $s_i$ may be formed in a region within 80 μm from the central axis. Therefore, the inclination θ of the excitation light is selected within 17 mrad from the central axis. In order to attain high brightness, it is desirable to use the focusing lens 2 having a large numerical aperture, for example, an NA of 0.4 or more. In particular, the aspherical lens that satisfies the above specifications is used as a pickup for an optical recording medium, so that there is an advantage in that the aspherical lens is available at low cost.

In the photo electric film 10, an electron source (NEA electron source) using a negative electron affinity is formed using a compound semiconductor film containing p-type GaAs as a main component, a surface of which is provided with a work function lowering film mainly formed of Cs. According to the study of the inventors, when continuously oscillating excitation light is continuously emitted to such a photo electric film, maximum brightness of an electron source is about $1 \times 10^7$ A/sr/m²/V. This value is equivalent to a value of a Schottky emission (SE) electron source used in a high-resolution electron microscope by heating Zr—O/W. On the other hand, a cold field emission (CFE) electron source having higher brightness is used in a high-resolution electron microscope, and since the CFE electron source has brightness of about 10 times brightness of the SE electron source, a highest-resolution electron microscope using an NEA electron source cannot be achieved unless an electron source having at least the same brightness as the CFE electron source can be achieved.

It has been found that, when the NEA electron source is irradiated with pulse excitation light having a pulse width of about 10 nanoseconds instead of continuously oscillated excitation light, brightness equal to or higher than brightness of the CFE electron source is instantaneously attained. However, the time-averaged probe current amount $I_p$ needs to be a sufficient value in order to use an electron source of an electron microscope. Therefore, when the photo electric film 10 is continuously irradiated with pulse excitation light, an expected probe current amount is not attained from a brightness value at the time of irradiating the photo electric film 10 with single-shot pulse excitation light. That is, it was found that characteristics of an electron source attained by continuously radiating pulse excitation light were close to characteristics of an electron source attained by radiating continuously oscillated excitation light. Therefore, the present inventors have concluded that high brightness cannot be achieved in the case of time averaging even when pulse excitation light is used in one NEA electron source, and conceived a configuration in the present embodiment in which the plurality of NEA electron sources are formed in one photocathode. In the case of the NEA electron source, since a light focusing point of excitation light on a photocathode serves as an electron source, the plurality of NEA electron sources for instantaneously generating electron beams having high brightness by pulse excitation light can be formed in different places, and the electron beams are generated in a time-divided manner such that probe currents from the NEA electron sources do not overlap, and thus the NEA electron sources can be used as high-brightness electron sources of an electron optics. An electron microscope can be further increased in resolution by increasing brightness of an electron source of an electron optics, and a probe current is increased to further shorten a measurement time. It is easy to further increase brightness by increasing the number of time-divided electron sources to, for example, 10 or 100.

In a case where the photocathode 1 is not a photocathode using glass having a thickness of 1.2 mm as the transparent substrate 11, but a photocathode using a single-crystal semiconductor transparent substrate 60 having higher brightness, and the above-described aspherical lens is used as it is as the focusing lens 2, a spherical aberration correction plate 61 is inserted between the focusing lens 2 and the photocathode 1 as shown in FIG. 8. A refractive index and a thickness of the spherical aberration correction plate 61 are determined such that excitation light passes through the single-crystal semiconductor transparent substrate 60 and is focused on the photo electric film 10 with a small diffraction limit.

Since a feature of the NEA electron source is that Cs which reduces a work function of a cathode surface gradually evaporates, there is a phenomenon that an emitted probe current decreases as time elapses even when excitation light having the same intensity is radiated. Therefore, when it is desired to keep the probe current constant for a long time, as shown in FIG. 6, a Faraday cup 35 is disposed on a path of an electron beam and a fluctuation in a current amount of the pulse electron beam is detected by a current detector 36 so as to detect a decrease in the current amount or brightness of the pulse electron beam in the electron optics. When the control device 32 determines that the detected current amount decreases, the control device 32 sends the control signal 28 to the parallel light source 7. The controller 26 that received the control signal 28 adjusts an output of the laser light source 24 and/or an amplification factor and the like of the optical amplifier 105 so as to adjust an intensity of the excitation light 12. Alternatively, the controller 26 may change the inclination θ ($\theta_x$, $\theta_y$) of the excitation light 12b by changing the setting of the phase delay amounts in the phase adjusters 104 to another kind of phase delay amount data such that the excitation light is focused at a position which is not used as an electron source on the photocathode 1. In this case, the probe current amount is recovered by emitting a pulse electron beam from a new electron source.

In FIG. 6, the Faraday cup 35 is of an in-and-out type, and has a structure in which the Faraday cup can be placed in or pulled from an electron beam according to a current amount monitoring timing. On the other hand, the Faraday cup 35 may be fixed on a trajectory of the electron beam to continuously monitor a current amount. In this case, for example, a hole is formed at the center of the Faraday cup 35 to allow the electron beam that is radiated to the sample 20 to pass through the Faraday cup 35. Alternatively, a signal obtained by detecting, by the electron detector 19, secondary electrons or backscattered electrons generated from a standard sample may be used. Alternatively, an absorption current flowing into the sample 20 may be monitored. The absorption current can monitor a fluctuation of the electron beam by connecting a sample stage on which the sample 20 is placed to a GND via an ammeter.

The scanning electron microscope (SEM) according to the present embodiment is effective in observation using a pump-probe method. In the pump-probe method, a sample is excited by a pulse laser or the like, and a state in which the sample changes with elapsed time from the excitation is observed by the SEM. The SEM irradiates the sample with a pulse electron beam in synchronization with the irradiation of the sample with excitation light, and detects the amount of generated secondary electrons and backscattered electrons. By changing a timing of the irradiation with the pulse electron beam from a timing when the sample is irradiated with the excitation light, a temporal change of the sample can be detected based on a change in the amount of the generated secondary electrons and backscattered electrons. Since the electron gun according to the present embodiment can obtain an electron source having high brightness, a microstructure can be observed with high resolution. As described above, in the pump-probe method, it is required to synchronize the radiation of the excitation light on the sample with the radiation of the pulse electron beam. Therefore, a high time-accurate measurement can be performed with little time error (jitter) by extracting a part of the excitation light (a laser beam from the laser light source 24) radiated to the photocathode 1 or the excitation light radiated to the sample and using the other part of the excitation light as a trigger or seed light.

A semiconductive material other than those described above, such as GaN, InGaN, AlAs, and GaP may be used as the photocathode 1. Furthermore, the configuration of the electron gun according to the present embodiment is also effective for increasing brightness of a metallic photocathode which has a low quantum effect and is usually used as an electron source having low brightness. In general, since quantum efficiency of electron emission by light incidence is low in a material having no band gap such as metal, $LaB_6$, and $CeB_6$, brightness is low, and when such a material is used as a photocathode of an electron microscope, it is less likely to increase spatial resolution. This is because when an intensity of excitation light is increased by making it possible to increase an emitted current amount, a cathode is damaged due to damage to a material or evaporation. Even for such a photocathode, damage to a cathode surface is reduced to a minimum extent by changing an electron emission position in a time-divided manner, and high resolution or high-speed observation with high brightness can be performed.

Embodiment 2

In the electron optics shown in FIG. 7A, trajectories are controlled such that pulse electron beams from the plurality of NEA electron sources are radiated to one point of the sample 20. On the contrary, the sample 20 may be irradiated without controlling the trajectories in this manner. In this case, the pulse electron beams from the NEA electron sources are radiated to different positions corresponding to positions of the electron sources. A configuration (second electron microscope configuration) of a scanning electron microscope in this case is similar to the configuration shown in FIG. 6, and the deflection control signal 28*b* to the aligner 8 or the deflector 18 for controlling the trajectories of the electron beams is not necessary. As will be described later, since discrimination of detection signals corresponding to electron sources is required at the time of image formation depending on spatial resolution of the scanning electron microscope, the control device 32 outputs a discrimination signal 28*c* output in synchronization with the light emission control signal 27*a*.

FIG. 9A shows a detection system of the second electron microscope configuration. As shown in FIG. 9A, when trajectory control of pulse electron beams is not performed, pulse electron beams from the electron sources $s_1$ to $s_4$ are respectively incident on positions $p_1$ to $p_4$ of the sample 20 in a time-divided manner. FIG. 9A shows a state in which a pulse electron beam 13-1 from the electron source $s_1$ is incident on the position $p_1$ of the sample 20. Electrons 73 generated from a surface of the sample by the incidence of the pulse electron beam are detected by the electron detector 19.

As shown in FIG. 9B, the pulse electron beam 13 is deflected and controlled on an x-y plane of a surface of the sample 20 by the deflector 18. For example, the deflector 18 scans a two-dimensional measurement region using a method (raster scanning method) in which an electron trajectory 72 of the pulse electron beam is swept in an x direction first, then moved to a position shifted by a predetermined distance in the y direction, and then swept in the x direction again. FIG. 9C shows a relationship between a scanning direction and the positions $p_1$ to $p_4$ irradiated with the pulse electron beams from the electron sources $s_1$ to $s_4$. The positions $p_1$ to $p_4$ are arranged such that distances L between adjacent trajectories 74 at the positions $p_1$ to $p_4$ in the y direction when the electron trajectory 72 is swept in the x direction are equal. The positions $p_1$ to $p_4$ can be adjusted by the inclination θ ($θ_x$, $θ_y$) of excitation light focused on each electron source, and therefore, can be adjusted by the phase delay amounts set in the phase adjusters 104 in the excitation optical system. When high-accurate positioning is performed, the positions $p_1$ to $p_4$ irradiated with the pulse electron beams may be calibrated using a calibration sample provided with a predetermined pattern.

FIG. 9D shows magnitudes of detection signals $S_p$ output when electrons generated by irradiating the sample 20 with the pulse electron beam 13 from the electron sources $s_1$ to $s_4$ are detected by the electron detector 19. The detection signals $S_p$ having different intensities are output according to a state (a shape, a composition, and the like) of the sample 20 at positions irradiated with the pulse electron beam 13.

Here, when an interval between the positions $p_1$ to $p_4$ shown in FIG. 9A is fairly smaller than desired spatial resolution, it is not necessary to discriminate detection signals from the positions, and an SEM image may be formed by considering the detection signals from the same position. For example, it is assumed that the electron sources $s_1$ to $s_4$ on the photo electric film 10 are apart from one another by 100 μm at maximum, and a reduction ratio of the electron optics is 1/1000. In this case, the positions $p_1$ to $p_4$ are apart from one another by 100 nm at maximum (in the example shown in FIG. 9C, a distance 3L which is an interval between a trajectory 74-1 and a trajectory 74-4 is a maximum distance). Accordingly, when desired spatial resolution is larger than 100 nm, pulse electron beams having different irradiation positions can be considered as one beam.

On the other hand, when desired spatial resolution is 100 nm or less in the above-described example, detection signals at the time of radiating the pulse electron beams from the electron sources $s_1$ to $s_4$ are considered independently as detection signals from the respective positions $p_1$ to $p_4$. Therefore, a detection system shown in FIG. 9A is provided with a preamplifier 71 that amplifies detection signals from the electron detector 19 and a detection signal discrimination unit 70 that discriminates the amplified detection signals. The detection signal discrimination unit 70 discriminates, based on the discrimination signal 28*c* from the control device 32, a detection signal output from the preamplifier 71 is a detection signal obtained by radiating a pulse electron beam from which electron source. Here, although an example is illustrated in which detection signals are discriminated by a switch using the discrimination signal 28c, the detection signals may be converted into digital signals and then discriminated by signal processing.

A high-resolution image equivalent to the resolution of the first electron microscope configuration can be obtained by forming an image using detection signals discriminated in this manner by an image forming unit as detection signals at different positions on a sample. This is because, in the case of the second electron microscope configuration, when a sweep speed is set to ¼ of a sweep speed in the first electron microscope configuration in which trajectories of the pulse electron beams are controlled, a total amount of probe currents for obtaining one SEM image is the same since four pulse electron beams are swept at once as shown in FIG. 9C.

As a more positive application of the second electron microscope configuration, in a case where a point to be measured on a sample is limited, when the position $p_i$ (i=1 to n) is determined in a manner of being arranged at the point and a pulse electron beam is radiated, extremely high-speed measurement can be performed.

A measurement time can be shortened by increasing a repetition frequency of excitation light for generating pulse electron beams. On the other hand, in a configuration of a detection system that obtains a detection signal at each position $p_i$ by time division in the electron detector 19 as shown in FIG. 9A, there is a possibility that response characteristics of the detection system cannot follow a switching speed of the pulse electron beams. In this case, an SEM image can be obtained by using the detection system as a projection optical system, enlarging signal electrons for each position $p_i$ by the projection optical system, and forming an image in an imaging device. The detection system based on the projection optical system is also effective in a case where a response speed of the detection system is limited by, for example, afterglow characteristics of a scintillator.

Although FIG. 9B shows an example in which raster scanning is performed with a pulse electron beam, the present invention is not limited thereto, and vector scanning, random scanning, or the like is also applicable depending on an application.

Embodiment 3

An example is described in Embodiment 1 and Embodiment 2 in which pulse electron beams are emitted as electron sources at a plurality of positions on the photocathode 1. Alternatively, pulse electron beams may be emitted as an electron source at one position on the photocathode 1. In this configuration, although brightness of an electron source is not as high as brightness in Embodiment 1 and Embodiment 2, there is an advantage in that an electron optics such as a common SEM can be used as it is, and a repetition frequency at which a pulse electron beam is emitted can be increased to cope with fast scanning. Since a diode laser can be used as the laser light source 24, the electron optics is inexpensive, has a wide selection of pulse widths and repetition frequencies, and can generate pulse light of any frequency that changes over time, which is preferable for use.

FIG. 10 shows a configuration of an excitation optical system that forms a single electron source on the photocathode 1. Since a basic configuration of the excitation optical system is the same as the configuration shown in FIG. 1C, the same components are denoted by the same reference signs, and redundant description will be omitted. The excitation optical system is provided with an optical monitor 801 that measures whether the excitation light 12 is emitted parallel to the central axis 101. Although the optical monitor 801 can use the configuration shown in FIG. 5 as it is, an optical monitor having a more simplified configuration is shown here. The optical monitor 801 includes a transparent mirror 802 and a light detector 803. The light detector 803 is disposed such that, when the excitation light 12 is parallel to the central axis 101, reflected light from the transparent mirror 802 is perpendicularly incident on a light receiving surface. An optical phase controller 804 adjusts phase delay amounts of the phase adjusters 104 of the excitation optical system, the light detector 803 monitors an intensity of the reflected light from the transparent mirror 802, and the excitation light 12 is parallel to the central axis 101 when the intensity of the detected reflected light is maximum. The phase delay amounts of the phase adjusters 104 at this time are stored in a storage of the optical phase controller 804.

An electron gun structure according to the present embodiment is the same as the electron gun structure shown in FIG. 1A or FIG. 8, an applied electron optics is the same as that shown in FIG. 6, and a configuration corresponding to the plurality of electron sources is not necessary. Specifically, in the excitation optical system shown in FIG. 10, the optical phase controller 804 does not need the phase control signal 27b for switching each of the phase delay amounts of the phase adjusters 104 for a respective one of pulse laser beams, and does not need the deflection control signal 28b for the aligner 8 or the deflector 18 for controlling the trajectories of the electron beams in the electron optics shown in FIG. 6.

The same excitation optical system can be implemented using a half mirror as the optical splitter 103 and the optical combiner 106. FIG. 11A shows a configuration example of such an excitation optical system. The half mirror is an optical element that transmits half of incident laser beam and that reflects half of the laser beam. A pulse laser beam from the laser light source 24 is split into two laser beams of transmitted light and reflected light by an optical splitting half mirror 901, and after phases are adjusted and amplified by the phase adjuster 104 and the optical amplifier 105, the laser beams are combined again by an optical combining half mirror 903 and become the one beam of excitation light 12. Since traveling directions of the transmitted light and the reflected light from the optical splitting half mirror 901 have an angle of 90 degrees, mirrors 902 are disposed in both optical paths in order to combine the transmitted light and the reflected light using the optical combining half mirror 903. Similarly to FIG. 10, the optical monitor 801 that measures whether the excitation light 12 is emitted along the central axis 101 is provided. An optical phase controller 904 adjusts phase delay amounts of the phase adjusters 104 of the excitation optical system, the light detector 803 monitors an intensity of the reflected light from the transparent mirror 802, and the excitation light 12 is parallel to the central axis 101 when the intensity of the detected reflected light is maximum. Phase delay amount data indicating the phase delay amounts of the phase adjusters 104 at this time is stored in a storage of the optical phase controller 904.

FIG. 11B shows another configuration example of an optical monitor. In the example shown in FIG. 11B, a light detector 905 is used as an optical monitor, and the light detector 905 is provided on an opposite side of the optical combining half mirror 903 relative to an extraction direction of the excitation light 12. When laser beams split by the optical splitting half mirror 901 are combined while phases are shifted, uncombined light 906 is emitted corresponding to the phase shift. The phase delay amounts of the phase adjusters 104 are adjusted such that the uncombined light 906 detected by the light detector 905 is minimized.

A half mirror splits a laser beam into two beams. The transmitted light and the reflected light from the optical splitting half mirror 901 can be split into a total of four beams when the transmitted light and the reflected light are split at the half mirror. As described above, when the half mirror is used as an optical splitter and an optical combiner, the number of branches can be freely set.

A similar excitation optical system can be implemented using a polarizing beam splitter (PBS) instead of the half mirror. In this case, since the split laser beams 109 are linearly polarized, it is necessary to adjust a polarization state when the laser beams 109 are recombined.

In order to minimize a diameter of an electron beam on a sample at the time of high-resolution observation, the excitation light 12 emitted from the parallel light source 7 is preferably coherent light with parallel and uniform wavefronts so as to form a best focal point on the photo electric film 10 of the photocathode 1 as shown in FIG. 1A or FIG. 8. When this condition is not satisfied, the diameter of the electron beam on the sample increases. Since the excitation optical system according to the present embodiment can easily change the condition by controlling phases of split laser beams, a state in which the phases of the split laser beams are shifted can be actively used.

For example, when an intensity and parallelism of the excitation light 12 deteriorate due to a shift in the phase delay amount of one or more phase adjusters without completely matching phases of split laser beams in the excitation optical system, an intensity of focal points on the photo electric film 10 formed by the focusing lens 2 decreases, and a focusing diameter also increases. Since pulse electron beams formed by pulse laser beams that are incompletely combined in such a manner have a wide light source diameter and a small current amount, an electron beam probe radiating on a sample has a large diameter, and a current amount decreases. Electrification of the sample during observation can be removed by making a pulse width of the electron beam probe longer than a pulse width of an electron beam probe for observation and radiating the electron beam probe on the sample. Accordingly, observation can be performed while preventing electrification without changing any other conditions during SEM observation.

The photo electric film 10 of the photocathode 1 is not limited to the above-described GaAs-based NEA electron source, and may be made of GaP, AlGaAs, GaN, InGaN, or the like, or may be a metal film such as a gold film.

Although the invention made by the present inventor has been specifically described above based on the embodiments, the invention is not limited thereto, and various modifications can be made without departing from the gist of the invention. For example, although a scanning electron microscope has been described as an example of an electron microscope, the present invention can be applied to various electron beam application devices such as a transmission electron microscope and a scanning electron microscope. The electron beam application device is not limited to an electron beam application device including an electron detector that detects electrons (secondary electrons, backscattered electrons, and the like) generated by radiation of an electron beam, and may include other detectors such as a detector that detects characteristic X-rays.

REFERENCE SIGNS LIST

1: photocathode
2: focusing lens
3: extractor electrode
4: cathode holder
5: acceleration power supply
6: window
7: parallel light source
8: aligner
9: vacuum container
10: photo electric film
11: transparent substrate
12: excitation light
13: pulse electron beam
14: opening
15: photo excited electron gun
16: electron optics column
17: electron lens
18: deflector
19: electron detector
20: sample
24: laser light source
25: pulse light power supply
26: controller
27*a*: light emission control signal
27*b*: phase control signal
28: control signal
28*b*: deflection control signal
28*c*: discrimination signal
29: objective lens
30: trajectory of pulse electron beam
31: condenser lens
32: control device
33: aligner power supply
34: optical axis of electron optics
35: Faraday cup
36: current detector
51: electro-optical element
52: voltage applying power supply
53: semiconductor amplifying element
54: current applying power supply
55: optical amplifying fiber
56: pump light source
57: coupler
58: wavelength converter
60: single-crystal semiconductor transparent substrate
61: spherical aberration correction plate
70: detection signal discrimination unit
71: preamplifier
72: electron trajectory of pulse electron beam
73: electron
74: trajectory
101: central axis of excitation light focusing optical system
103: optical splitter
104: phase adjuster
105: optical amplifier
106: optical combiner
107: optical monitor
108: optical phase controller
109: split laser beam
110: imaging lens
111: transparent mirror
112: sample light
113: image sensor
114: diffractive optical element
115: collimator
119: laser beam
801: optical monitor
802: transparent mirror 803, 905: light detector
804, 904: optical phase controller
901: optical splitting half mirror
902: mirror
903: optical combining half mirror
906: uncombined light
The invention claimed is:

1. An electron beam application device comprising:
an electron gun that includes a photocathode including a substrate and a photo electric film, a light source configured to emit pulse excitation light, and a focusing lens configured to focus the pulse excitation light toward the photocathode and that is configured to emit pulse electron beams from a position of the photo electric film where the pulse excitation light is focused; and
an electron optics configured to irradiate a sample with the pulse electron beams,
wherein the light source includes;
   a laser light source,
   a power supply configured to supply power to the laser light source to emit a pulse laser beam,
   an optical splitter configured to split a pulse laser beam emitted by the laser light source into a plurality of pulse laser beams,
   a plurality of phase adjusters each provided for a respective one of the plurality of pulse laser beams and configured to adjust phases of the pulse laser beams split by the optical splitter,
   a plurality of optical amplifiers each provided for a respective one of the plurality of pulse laser beams and configured to amplify the pulse laser beams split by the optical splitter,
   an optical combiner configured to combine the plurality of pulse laser beams whose phases are adjusted by the phase adjusters and that are amplified by the optical amplifier, and output the light from the pulse laser beams, and
   an optical phase controller configured to control phase delay amounts of the plurality of phase adjusters,
wherein the optical phase controller stores phase delay amount data indicating the phase delay amounts of the plurality of phase adjusters in which an inclination of the pulse excitation light relative to an optical axis of the focusing lens is a predetermined value, and sets the phase delay amounts of the plurality of phase adjusters based on the phase delay amount data,
wherein the phase delay amount data indicates phase delay amounts of the plurality of phase adjusters when the pulse excitation light is parallel to the optical axis of the focusing lens,
wherein the light source further includes a controller configured to control the power supply and the optical phase controller,
wherein the controller outputs a light emission control signal for controlling light emission of the laser light source to the power supply,
wherein when the laser light source is caused to emit light having a first pulse width, the optical phase controller sets phase delay amounts of the plurality of phase adjusters based on the phase delay amount data, and
wherein when the laser light source is caused to emit light having a second pulse width longer than the first pulse width, the optical phase controller changes a phase delay amount of at least one of the plurality of phase adjusters in a manner of increasing a focusing diameter of the pulse excitation light on the photo electric film.

2. The electron beam application device according to claim 1, wherein
   the controller outputs, to the optical phase controller, a phase control signal synchronized with a light emission control signal output to the power supply to control light emission of the laser light source, and
   the optical phase controller stores a plurality of pieces of the phase delay amount data in which inclinations of the pulse excitation light relative to the optical axis of the focusing lens have different values, and switches each piece of the phase delay amount data for setting the phase delay amounts of the plurality of phase adjusters for a respective one of the pulse laser beams.

3. The electron beam application device according to claim 2, further comprising:
   a control device, wherein
   the electron optics includes an aligner or a deflector configured to control trajectories of the pulse electron beams, and
   the control device outputs a deflection control signal synchronized with the light emission control signal to the aligner or the deflector, and controls the trajectories of the pulse electron beams deflected by the aligner or the deflector to be the same.

4. The electron beam application device according to claim 2, wherein
   the electron optics includes a deflector configured to sweep the pulse electron beams in a first direction on the sample, and
   trajectories of positions irradiated with the pulse electron beams on the sample are arranged at an equal interval in a direction perpendicular to the first direction.

5. The electron beam application device according to claim 4, further comprising:
   a detection system that includes an electron detector configured to detect electrons generated by irradiating the sample with the pulse electron beams; and
   a control device, wherein
   the control device outputs a discrimination signal synchronized with the light emission control signal to the detection system, and
   the detection system discriminates positions irradiated with the pulse electron beams and forms an image based on a detection signal from the electron detector.

6. The electron beam application device according to claim 2, further comprising:
   a control device, wherein
   the electron optics includes an electron beam monitor configured to monitor a fluctuation of the pulse electron beams, and
   the control device outputs a control signal for recovering a current amount of the pulse electron beams to the controller when the electron beam monitor determines that a current amount of the pulse electron beams decreases.

7. The electron beam application device according to claim 6, wherein
   the controller receives the control signal and adjusts an output of the laser light source and/or an amplification factor of the optical amplifier.

8. The electron beam application device according to claim 6, wherein
   the controller receives the control signal and changes the phase delay amount data used by the optical phase controller to set each of the phase delay amounts of the plurality of phase adjusters for a respective one of the pulse laser beams.

9. The electron beam application device according to claim 1, wherein light emission of the laser light source is synchronized with excitation light to be radiated to the sample.

10. The electron beam application device according to claim 1, wherein the light source includes an optical monitor configured to monitor whether the pulse excitation light is parallel to the optical axis of the focusing lens, and the optical monitor includes a transparent mirror on which the pulse excitation light is incident and that reflects a part of the pulse excitation light, and a light detector disposed such that reflected light from the transparent mirror is incident perpendicularly on a light receiving surface when the pulse excitation light is parallel to the optical axis of the focusing lens.

11. The electron beam application device according to claim 1, wherein the photo electric film includes a compound semiconductor film and a work function lowering film provided on a surface of the compound semiconductor film.

12. The electron beam application device according to claim 1, wherein each of the optical splitter and the optical combiner includes a diffractive optical element and a collimator, and a pulse laser beam perpendicularly incident on the diffractive optical element is split into a plurality of pulse laser beams, and optical paths of the plurality of pulse laser beams are made parallel to one another by the collimator.

13. The electron beam application device according to claim 1, wherein the light source includes an optical monitor configured to detect an inclination of the pulse excitation light relative to the optical axis of the focusing lens, and the optical monitor includes a transparent mirror on which the pulse excitation light is incident and that reflects a part of the pulse excitation light, an imaging lens that is disposed such that an optical axis of the imaging lens is perpendicular to the optical axis of the focusing lens and on which reflected light from the transparent mirror is incident, and an image sensor that is disposed such that a distance from the imaging lens is a focal length of the imaging lens.

14. The electron beam application device according to claim 1, wherein the optical splitter and the optical combiner are a half mirror.

15. The electron beam application device according to claim 14, wherein the light source includes an optical monitor configured to monitor whether the pulse excitation light is parallel to the optical axis of the focusing lens, and the optical monitor is a light detector configured to monitor uncombined light from the optical combiner.

* * * * *